United States Patent [19]
Hennig

[11] Patent Number: 5,564,412
[45] Date of Patent: Oct. 15, 1996

[54] MAGNETIC RESONANCE IMAGING METHOD FOR LOCALIZING DISCRETE DETAILS WITHIN A MEASURED OBJECT

[76] Inventor: Jürgen Hennig, Johann-von-Weerth-Strasse 12, D-79100 Freiburg, Germany

[21] Appl. No.: 228,414

[22] Filed: Apr. 15, 1994

[30] Foreign Application Priority Data

Apr. 26, 1993 [DE] Germany .......................... 43 13 631.1

[51] Int. Cl.$^6$ .................................................. A61B 5/055
[52] U.S. Cl. ...................... 128/653.2; 324/307; 324/309
[58] Field of Search .............................. 128/653.2, 653.3; 324/307, 309, 306

[56] References Cited

U.S. PATENT DOCUMENTS

| | | |
|---|---|---|
| 4,607,222 | 8/1986 | Yokoyama et al. . |
| 4,984,160 | 1/1991 | Saint Felix et al. . |
| 5,051,698 | 9/1991 | Ordidge . |

FOREIGN PATENT DOCUMENTS

| | | |
|---|---|---|
| 2946820 | 5/1980 | Germany . |
| 3838792 | 5/1990 | Germany . |

OTHER PUBLICATIONS

Hausser, K. H. and Kalbitzer, H. R.: NMR Fur Mediziner und Biologen Springer Verlag, Berlin/Heidelberg, 1989, p. 143 ff.

Lauterbur, P. C.: Image Formation by Induced Local Inter-actions: Examples Employing Nuclear Magnetic Resonance. In Nature, vol. 242, Mar. 1973, pp. 190 ff.

Bottomley, Paul A.: NMR Imaging Techniques and Applications: A Review. In Rev. Sci. Instrum. vol. 53, No. 9, 1982 p. 131.

*Primary Examiner*—Ruth S. Smith

[57] ABSTRACT

In a medical resonance imaging method (NMR-tomography) the following program steps are executed in order to localize the position of a finite number e of discrete individual objects in a selected slice within a measuring object after recording of two slice selective projections in different directions: determining the position of the e individual objects based on the previously carried out recording steps; inquiring whether the localization of the e individual objects is unique; if yes, then ending the program execution; if no, then inquiring whether the number n of non-unique possibilities is smaller than a predetermined threshold value s; if yes, then carrying out a further program step with an encoding parameter which is changed with respect to all previously executed steps in accordance with a fixed predetermined scheme and subsequently returning to the first program step; if no, then calculating an encoding parameter which is suitable for resolving at least the majority of non-unique possibilities for the subsequent recording step, carrying out this recording step, and ending program execution.

13 Claims, 16 Drawing Sheets

Refocussing profile
Recording 1

Recording 2

MAGNETIC RESONANCE IMAGING METHOD FOR LOCALIZING DISCRETE DETAILS WITHIN A MEASURED OBJECT

BACKGROUND OF THE INVENTION

The invention concerns a method of magnetic resonance imaging (NMR-tomography) for the representation of details of a measured object in a homogeneous stationary magnetic field $B_0$ with which, in a first recording step and in a selected slice of the measured object, a first projection, in a first direction within the plane of the slice is recorded, and in a second recording step, a second projection, in a direction differing from that of the first direction and preferentially perpendicular thereto, is recorded in the plane of the slice.

A method of this type is, for example, known in the art from the textbook of K. H. Hausser and H. R. Kalbitzer "NMR für Mediziner und Biologen", Springer-Verlag, Berlin-Heidelberg, 1989, in particular starting on page 143.

The recording of one-dimensional projections is already described by P. Lauterbur in the journal "Nature", vol. 242 (1973) starting on page 143. Pulse programs for the recording of a projection using a gradient echo sequence are, for example, known in the art from Haase et al., J. Magn. Reson., vol. 67 (1986) starting on page 217.

A series of application areas for magnetic resonance imaging concern themselves with the determination and representation of discrete structures in the human body. This is true, on the one hand, for MR-angiography with the assistance of the so-called time-of-flight (TOF) method with which those vessels which travel perpendiculary through the plane of investigation show signal strength, whereas signals from stationary tissue are suppressed. With such methods, one often encounters the situation that the number of vessels is very small in comparison to the number of measured points which are necessary in order to generate the two-dimensional images. Typically, the number of represented vessels in a cross section of a body is less than 100 and often less than 10, whereas the number of points in the image matrix usually assumes a value of 256×256=65536.

The application of conventional imaging procedures such as the two-dimensional Fourier transformation method consequently results in a large disproportion between the number of objects about which information is intended to be gleaned and the number of measured points.

It is therefore the purpose of the present invention to present a method of the above-mentioned kind with which small individual objects within a measuring object in a selected planar slice can be localized in as unique a manner as possible, whereby as small a number of recording steps as possible should be carried out and the method should be capable of automatization.

SUMMARY OF THE INVENTION

In accordance with the present invention, this purpose is achieved in that, to localize the position of a finite number e of discrete individual objects in the chosen slice within the measured object, the following additional program steps are carried out:
a) Determining the position of the e individual objects based on the recording steps previously carried out;
b) Inquiring whether the localization of the e individual objects following step a) is unique;
b1) if yes, then ending the program execution;
b2) if no, then step c);
c) Inquiring whether the number n of non-unique possibilities is less than a predetermined threshold value s;
c1) if yes, then carrying out a further recording step with an encoding parameter which has been changed relative to all previously carried out recording steps in accordance with a specific predetermined scheme and subsequently returning to step a);
c2) if no, then calculating an encoding parameter which is suited for resolving at least the majority of non-unique possibilities for a subsequent recording step, carrying out this recording step and ending program execution.

A particularly preferred embodiment of the inventive method is configured in such a fashion that, in the first recording step, the nuclear spins in a slice of the measuring object are excited in the presence of an applied slice selection gradient $G_s$ through the radiation of a high frequency (HF)-excitation pulse of small excitation band width, the slice being defined by the strength of the stationary magnetic field $B_0$, the position-dependent strength of the slice selection gradient $G_s$ and the frequency band given by the excitation band width of the excitation pulse and subsequently, through inversion of the slice selection gradient $G_s$, the defocussing of the excited nuclear spin at different positions in the slice caused by the slice selection gradient is reversed and finally, through application of a projection gradient $G_p$ in a direction forming preferentially a right angle with respect to the direction of the slice selection gradient $G_s$, and through subsequent inversion of the projection gradient $G_p$, a gradient echo is produced and recorded and, the procedure of the first recording step is repeated in a second recording step having identical slice gradient and changed direction of the projection gradient so that this gradient is likewise applied preferentially perpendicular to the slice gradient, however, in a direction which is different than and preferentially perpendicular to the direction of the projection gradient in the first recording step.

Preferentially in a third step a third projection in a direction differing from that of the first and the second directions is recorded within the plane of the slice. If only a small number of individual objects are present in the measured object and if the projection direction of the third projection is well-chosen so that only unique points of intersection are present, then it is possible to already terminate the measurement program after the third recording step.

When applying the inventive method to measured objects with many individual objects in the chosen slice, a fourth and each subsequent recording step can be a projection, whereby the encoding parameter in step c1) or c2) is the projection angle of the corresponding projection.

In particular, the recording of the third and each additional projection can be done in a direction which lies halfway between the projection angles of the preceding projections.

Alternatively thereto, in a simplified variation of the method, the projection angles of the third and of each additional projection can be incremented by a fixed predetermined value with respect to the projection angle of the corresponding preceding projection.

Instead of carrying out the program steps a) to c2) it is possible, in particularly simple variation of the method, to record r additional projections at predetermined differing projection angles, whereby r is approximately equal to the number e of individual objects and much smaller than 256. In this fashion, the occurrence of possible non-uniqueness of the localization is accepted, whereby the probability of such non-uniqueness decreases quickly with the number of projections in differing directions, and can be optimized through choice of an appropriate projection number.

In another embodiment signals are taken in only two projection directions, whereby the angle between the two projection directions is chosen to be sufficiently small that, in each case, at most one point of intersection of two projections rays, which are defined to be perpendicular to the direction of projection at the position of the signals of the observed objects, lies in the observational volume.

In a preferred embodiment of the inventive method the intensity information of each signal of all preceding recording steps is taken into consideration in order to reduce possible non-uniqueness in localizing the position of the e individual objects.

In additional variations of the method, recording steps are carried out in only two projection directions, whereby however, a plurality of signals is recorded in one or in both directions. In an alternative method the signals of the individual objects in identical projection directions are phase-modulated through an additional phase modulation gradient perpendicular to the projection gradient so that the position of each individual object is determined by the phase-modulated signals.

In another alternative a spin-echo is produced by applying a gradient in a direction perpendicular to the slice selection gradient $G_s$ and to a projection gradient $G_p$ and by utilizing a frequency and amplitude-modulated refocussing pulse, the spin-echo being read out by renewed application of the projection gradient $G_p$ so that the amplitude and/or phase of the signal of each individual object varies as a function of its positional coordinate in a direction perpendicular to the slice selection and projection gradients for differing recordings at the same projection direction and the position of each individual project is uniquely defined by the recording of a plurality of such amplitude and/or phase-modulated projections.

In a further embodiment a spin-echo sequence is utilized for signal production instead of a gradient echo sequence.

It is also possible to modify the inventive method in such a fashion that, for the investigation of discrete structures in a quasi-homogeneous object such as the human body, the separation process which is necessary for and directed towards the localization of discrete structures can be carried out in such a fashion that the measuring sequence accents the structures to be observed through optimizing the measuring parameters so that they can be recognized with respect to the continuum of remaining quasi-homogeneous signals by establishing threshold values (time-of-flight angiography).

A variation of this embodiment provides for carrying out the process of separating the structures to be localized by constructing differences between sequential recordings so that those discrete structures whose signals differ in the two recording cycles are recognized by the localization criteria, whereby these differences between the two recording cycles are effected through application of a contrast medium between the two recording cycles.

Another variation of this embodiment is characterized in that the process of separating the structures to be localized is effected through subtraction of sequential recordings so that those discrete structures whose signals differ in both recording cycles are detected by the localization criterion, whereby these differences between the two recording cycles take place through saturation of a partial amount of the spins present in the entire volume by means of suitable saturation sequences which are per se known in the art so that the localization criterion is effected for all those structures which are engaged in an exchange of spins with the saturated spins. This occurs, for example, in the case of flowing blood, by saturation of the blood signal flowing into the observed slice.

Finally, a third variation of the method provides for effecting the separation process by repetition of the experiment under otherwise constant measuring conditions and determining signal differences between both recordings so that those discrete structures are recognized which are subject to an experiment-independent signal variation. This is, for example, the case for blood flowing in a pulsed-fashion.

The invention is more closely described and explained below with respect to the embodiment represented in the drawing. The features which can be derived from the description and the drawing can be utilized in other embodiments of the invention individually or collectively in arbitrary combination.

DESCRIPTION OF THE PREFERRED EMBODIMENT

Figure 1:
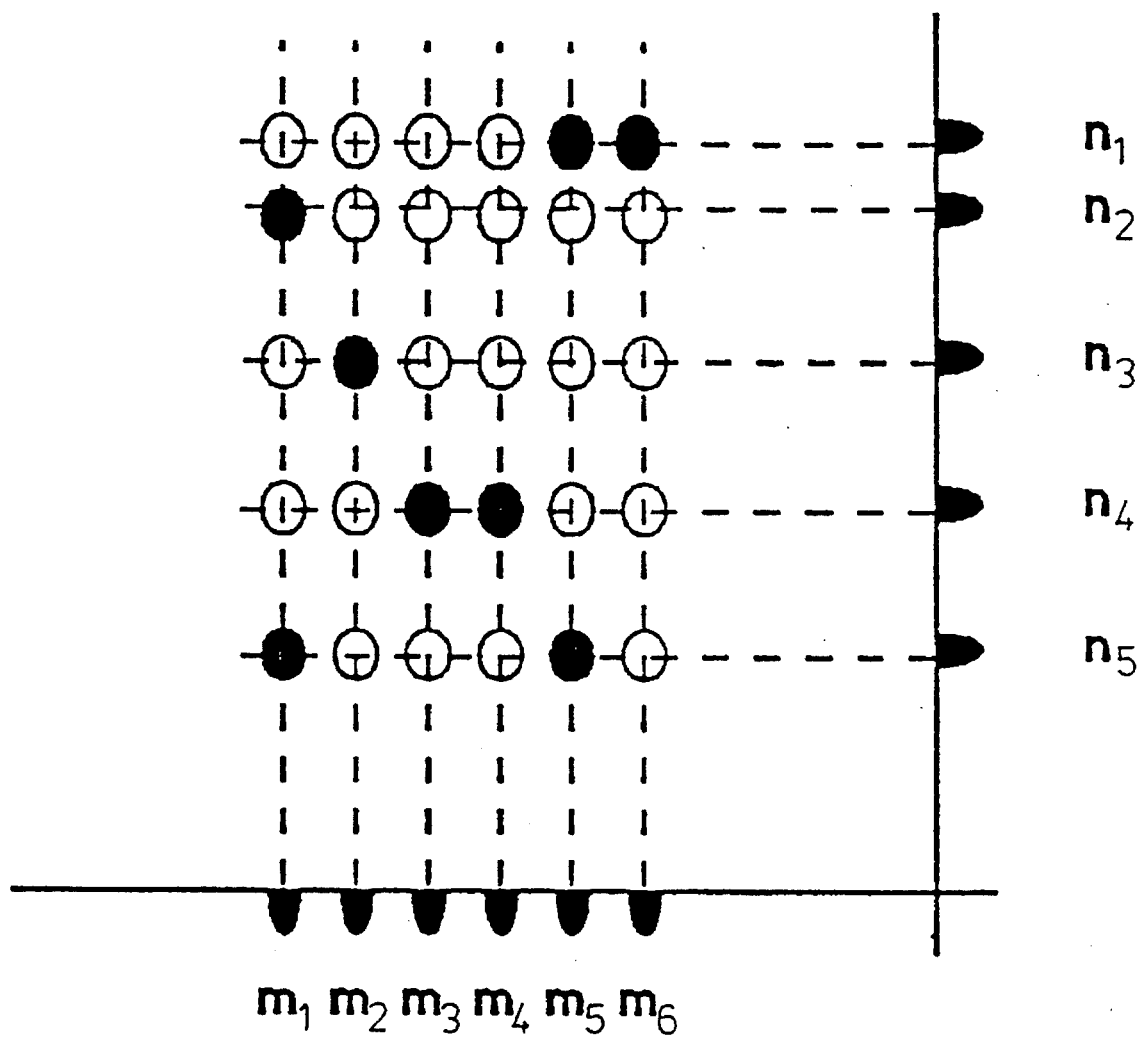
FIG. 1 shows a matrix of points constructed from the projection lines associated with the recording of two projections illustrating the principle of recording two one-dimensional projections for the location of discrete objects.

The invention concerns the localization of one or more small objects in the observational volume. Through the utilization of imaging techniques a large number (typically 256) of recording steps are necessary to determine the location and, if appropriate, the signal intensity of these objects so that a substantial unbalance obtains between the number of recording steps and the number of objects about which information is intended to be obtained. Typical application areas for such a situation are MR-angiography as well as contrast media investigations.

The point of departure of solving the problem is the recording of two one-dimensional projections through the measuring volume. The positions of more than one object are not uniquely determined by two projections. Below, various possibilities are described with which additional recording steps can lead to a unique localization, whereby the number of recording steps is smaller by a factor of 10–100 than those utilizing known imaging algorithms.

Conceptually, these methods correspond to the application of fundamental imaging procedures such as Fourier imaging or filtered back-projection, however, not based on a homogeneous matrix of image points but rather on a matrix of points given by the points of intersection of the projection lines of two preferentially perpendicular projections.

The gist of the method in accordance with the invention is the measurement of locations of a number of objects which is small compared to the number of points in a homogeneous image matrix by means of data taking and reconstruction algorithms whose complexity depends on the number of objects to be localized and not on the number of image points in a homogeneous imaging matrix.

The particular point which simplifies the solution of the posed problem given appropriate boundary conditions is the realization that the point matrix to be represented is sparsely occupied relative to a homogeneous image.

The method in accordance with the invention is based on the recording of one-dimensional projections through a cross section of the body. Information concerning the (two-dimensional) position coordinates derived from the (one-dimensional) recorded data is gleaned through the recording of additional projections either under variation of the projection angle (angulation method) or through modulation of the signal intensity in the direction perpendicular to the projection plane (amplitude method) or through modulation of the signal phase in the direction perpendicular to the projection plane (phase method). Mixtures of these methods are possible and are, in fact, often desirable. In this fashion, using the amplitude and phase methods, preferentially two initial projections are taken at different angles and first subsequent thereto is the resulting non-uniqueness resolved by means of amplitude or phase modulation.

The angulation method is described below in order to clarify the general fundamental principle of this method, whereby the case of locating a single object is initially described and is then generalized to the location of a plurality of objects.

The point of departure of all variations of this method is the measurement of projections through the investigational layer of the object at differing projection angles (FIG. 1), whereby this measurement can take place through the conventional gradient echo or spin-echo methods (FIG. 2a or FIG. 2b) or through another magnetic resonance imaging method which gives a one-dimensional position resolution through an object which is two-dimensional or is prepared by means of a slice selection pulse.

This projection determines the position of the objects in one direction, however, an arbitrary number of objects could be stacked behind each other along the projection direction. The determination of the number and location is described below with the assistance of the angulation method.

Angulation Method

Figure 3A:
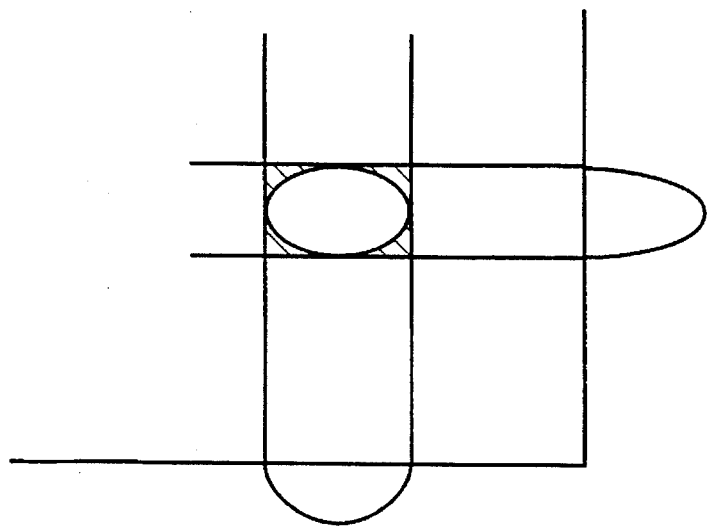
FIG. 3a shows the minimization of location uncertainties through the selection of perpendicular projections. The location of the object (cross-hatched area) given by the overlap region of the projection lines is minimized using perpendicular projection directions.
Figure 3B:
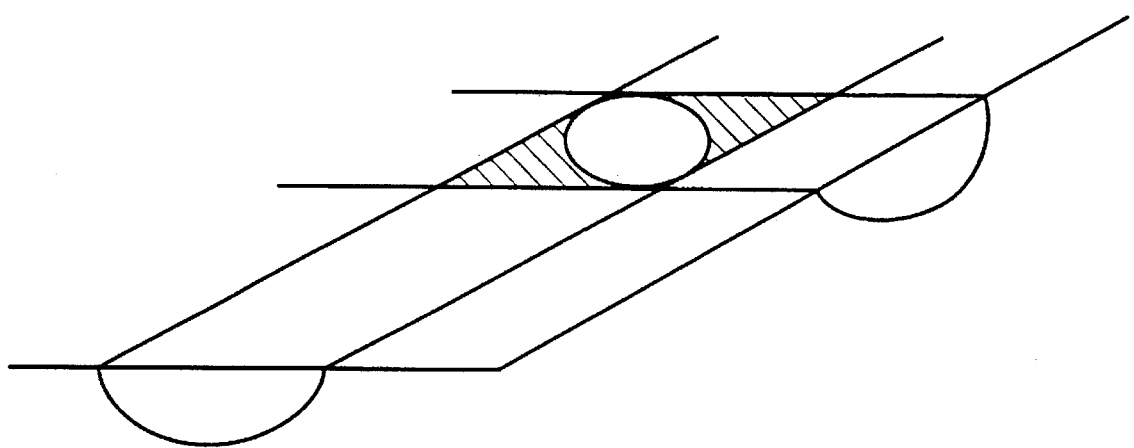
FIG. 3b shows the increase in location uncertainties through the selection of non-perpendicular projections. The location of the object (cross-hatched area) given by the overlap region of the projection lines is only minimized when perpendicular projection directions are used (compare FIG. 3a).

For the measurement of the position of an individual object the recording of only two projections is necessary which, in an advantageous case, are perpendicular to each other. With point-shaped objects, other angles between the projection directions, including small angles, are possible. With increasing object size the choice of perpendicular projection directions leads to a minimization of the localization precision (FIGS. 3a and 3b).

The location of the object can be determined as the point of intersection of the projection lines from these two projections.

Figure 4:
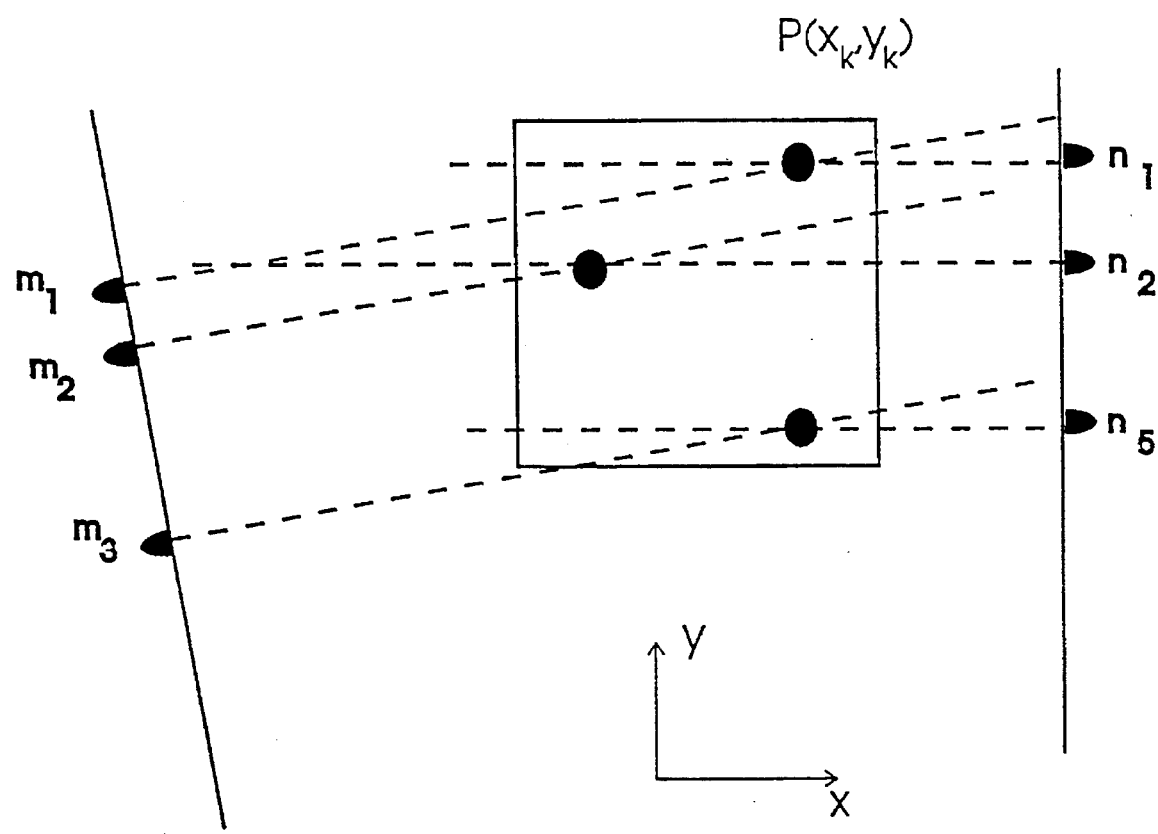
FIG. 4 shows the uniqueness of the localization when utilizing an acute angle projection direction. If each projection line exhibits only one point of intersection with a projection line of the other projection with the resident volume (rectangular frame), a unique localization is given.

If more than one object is located in the investigation volume, a unique localization with the assistance of two projections is possible if and only if the angle between both projections is chosen sufficiently small that uniqueness obtains with respect to the position of the projection points of intersections within the observational volume (FIG. 4). FIG. 4 clearly shows that this is achieved when the angle $\alpha$ between the two projection directions satisfies the inequality $$\tan(\alpha) < (x_k - x_l)/X$$

whereby $x_k$ and $x_l$ are the coordinates of the corresponding individual projections, X is the size of the observational volume and the indices k and l run over all objects. Here, naturally the size X of the observational volume must be known.

Figure 5:
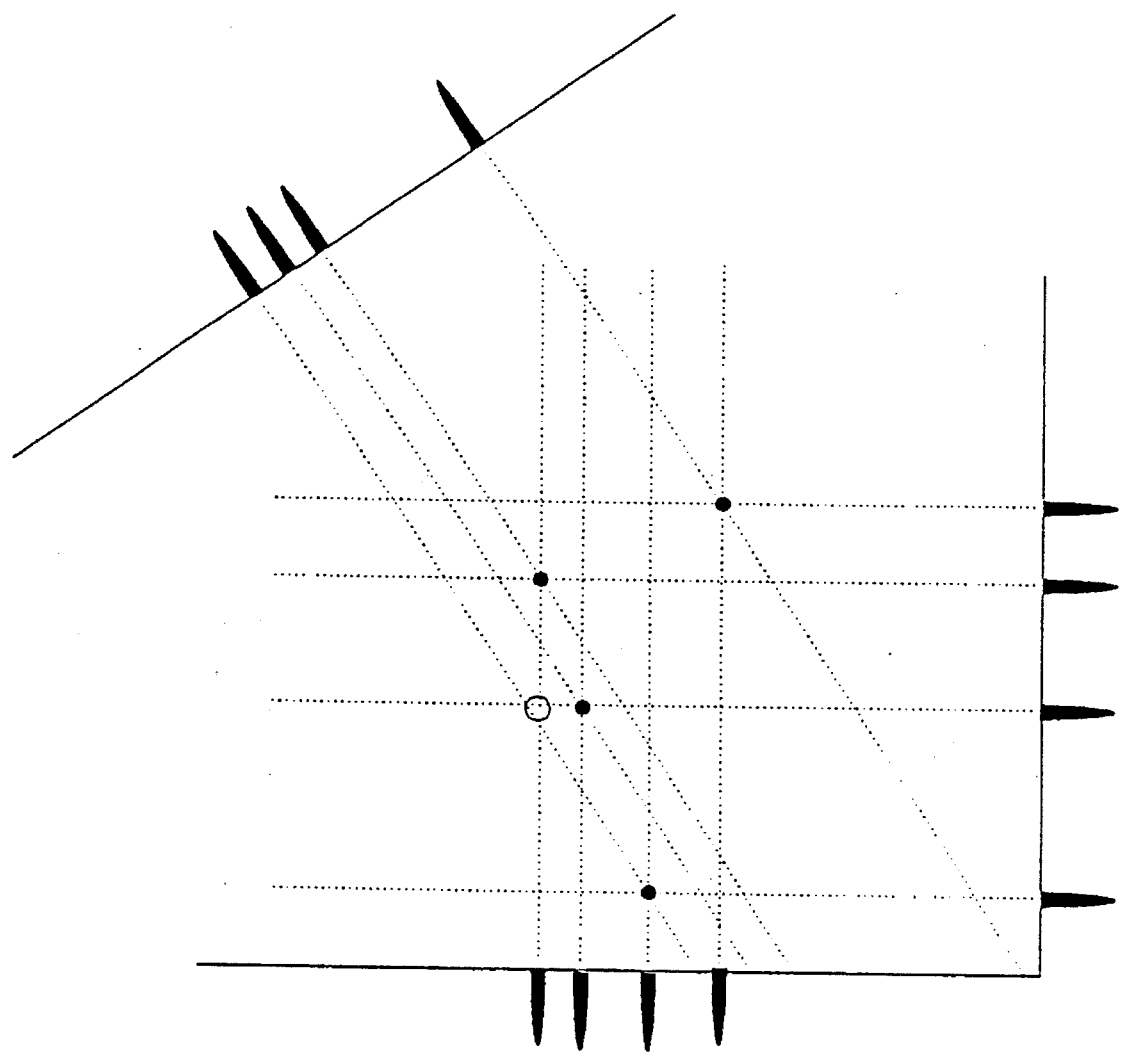
FIG. 5 shows a unique mapping via three projections. The position of the object is given by the common point of intersection of each projection line from each of the three projections (black points). The open circle indicates an accidental additional point at which the three projection lines nearly intersect and thereby indicates the danger of non-uniqueness in the localization.

If it is not possible to satisfy these conditions, for example, because two projections are too close to another or because, in order to minimize the error due to the determination of the point of intersection in advance, a larger angle $\alpha$ was chosen, the number of projections necessary to determine the location of all objects must be increased. For infinitely small objects for which the probability that all projections in each chosen projection direction appear separate and free of overlap is arbitrarily large, the taking of an arbitrarily oriented third projection is always sufficient. The number of individual projections observed in each projection direction is then equal to the total number of objects, the location of the objects being given by the common points of intersection of the projection lines from each projection direction (FIG. 5). However, the danger here of a quasi-non-uniqueness in the form of an accidental "near point of intersection" of three projection lines which do not belong to one object (open circle FIG. 5) is already large with a low number of objects. This danger increases rapidly with the number of objects even with small non-point-shaped objects.

Figure 6A:
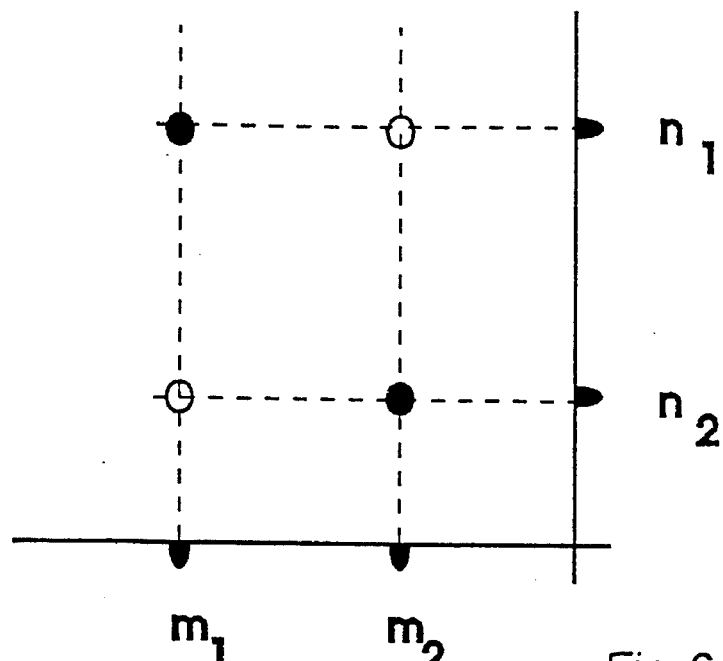
FIG. 6a shows the non-uniqueness of the localization when utilizing only two projections.
Figure 6B:
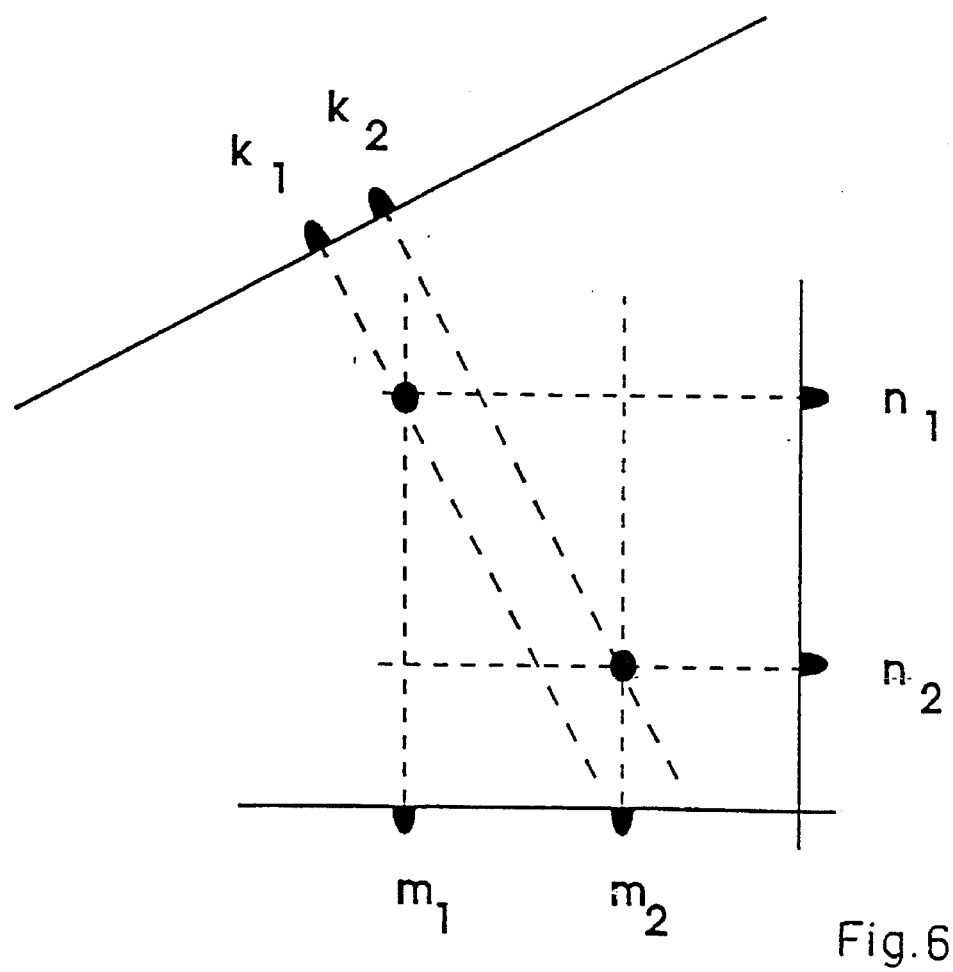
FIG. 6b shows the resolution in a non-uniqueness of the localization utilizing only two projections of FIG. 6a through the recording of an additional projection.

With objects having a size which cannot be approximately considered to be point-shaped or when a regular configuration of objects is expected from the configuration geometry, one must, in advance, assume that additional objects can be present at one or more additional points of intersection of the projection lines. This is shown in FIGS. 6a and 6b for each of two observed projections in the two primarily observed projection directions.

The projection lines yield four points of intersection in this case, so that it cannot be uniquely determined whether two, three or four objects are present in the observation volume. By measuring a further projection this is however uniquely possible.

In general, the maximum possible number of objects is given by $a_1 a_2$, whereby $a_1$ and $a_2$ are the corresponding numbers of observed objects in the two projection directions.

The determination of the location and number of actual objects present can only be accomplished through the recording of additional projections.

For the case of small objects it is possible to determine a third projection direction so that no additional ambiguity is possible. Towards this end the angle between all points of intersection of the $a_1 + a_2$ mutually perpendicular projection rays is determined. As can be easily shown, towards this end, it is necessary to calculate $(a_1-1)(a_2-1)$ angles at every point so that, taking into consideration the fact that the angle between the points $P(x_n, y_n)$ and $P(x_m, y_m)$—neglecting a direction dependent and therefore irrelevant difference of 180°—is equal to that between $P(x_m, y_m)$ and $P(x_n, y_n)$, a total number $A(a_1, a_2)$ of $$A(a_1, a_2) = a_1 a_2 (a_1 - 1)(a_2 - 1)/2 \qquad (1)$$

angles are to be calculated. The projection angle for the third projection is then so chosen that the projection angle is different than all these angles. In general, one maximizes the sum of angular separations between the projection angle and the corresponding intersection angles. The projection thereby formulated in the third direction shows all objects without overlap so that the number and location of all objects is completely defined.

As can be easily seen from equation (1), the number of intersection point angles to be calculated grows very quickly with the number of object projections observed in the first two recordings.

Tab. I shows the maximum number of angles to be calculated under the assumption that both first projections each show all objects.

|       |   |    | $a_1$ |     |     |     |     |
|-------|---|----|----|-----|-----|-----|-----|
| $a_2$ | 1 | 2  | 3  | 4   | 5   | 6   | 7   |
| 1     | 0 | 0  | 0  | 0   | 0   | 0   | 0   |
| 2     | 0 | 2  | 6  | 12  | 20  | 30  | 42  |
| 3     | 0 | 6  | 18 | 36  | 60  | 90  | 126 |
| 4     | 0 | 12 | 36 | 72  | 120 | 180 | 252 |
| 5     | 0 | 20 | 60 | 120 | 200 | 300 | 420 |
| 6     | 0 | 30 | 90 | 180 | 300 | 450 | 630 |
| 7     | 0 | 42 | 126| 252 | 420 | 630 | 882 |

Tab. I shows the maximum number of intersection point angles for calculating a projection angle for the unique determination of the number and position of objects.

As can be easily seen from Tab. I there is already a very large discrepancy between the number of objects and the number of intersection point angles for a small number of objects. In particular for rapid observations with which the recording time of all projections should be minimized this solution approach is inefficient even with the utilization of rapid computers.

Figure 7A:
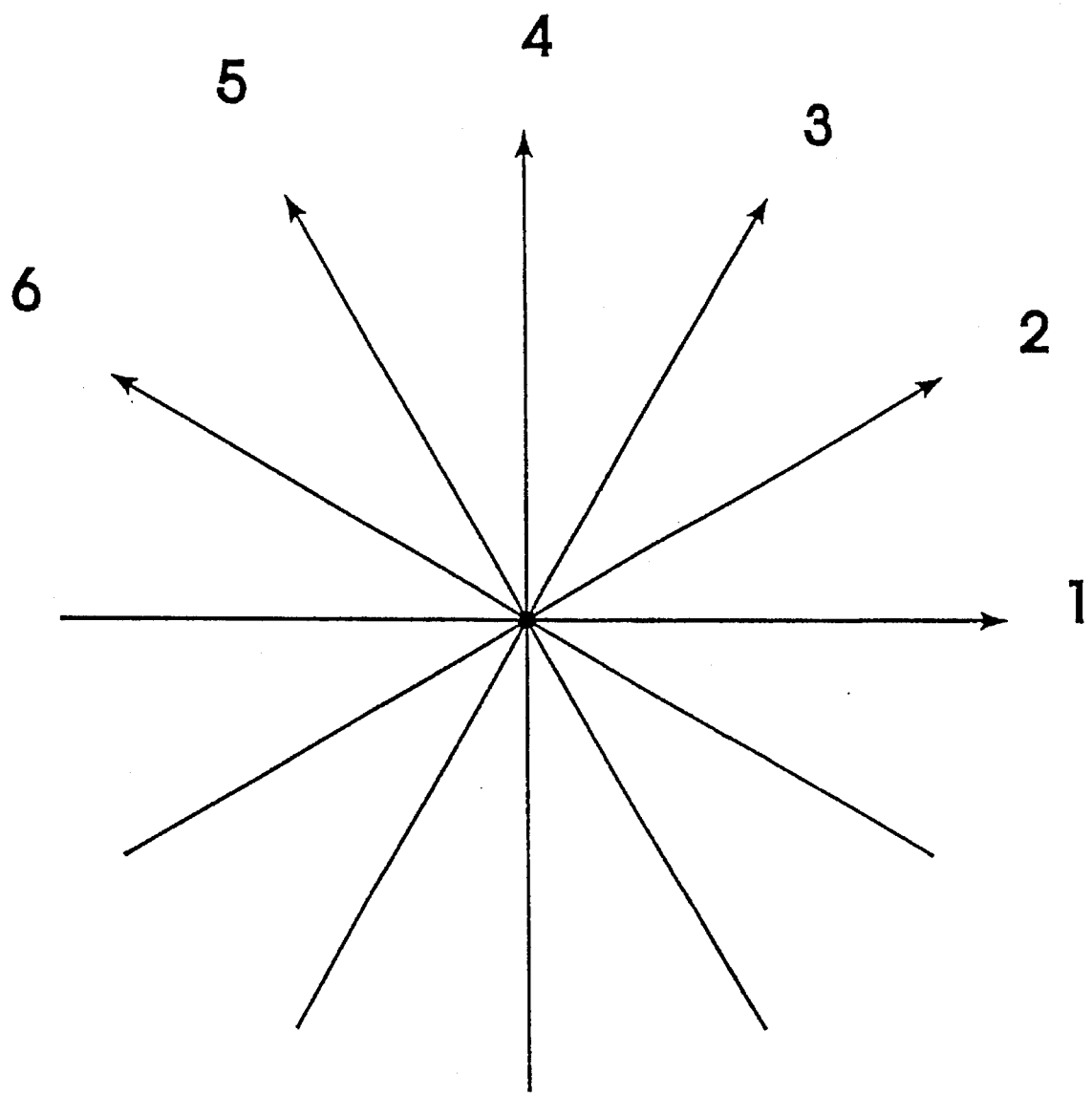
FIG. 7a shows the possibility of recording projections under incrementation by a particular angle.
Figure 7B:
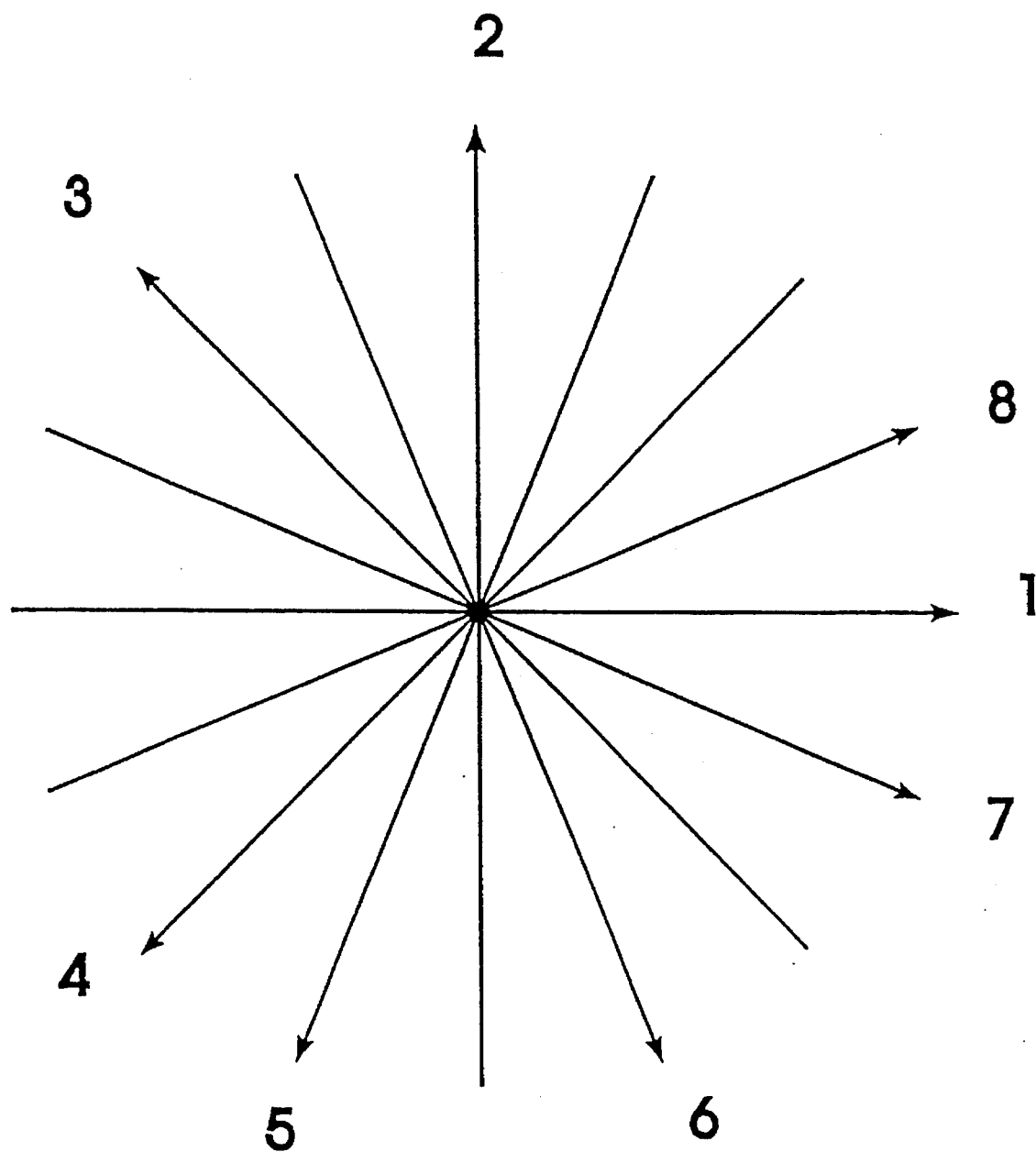
FIG. 7b shows the possibilities of recording projections in a direction halfway between the angles of the preceding recordings.
Figure 8:
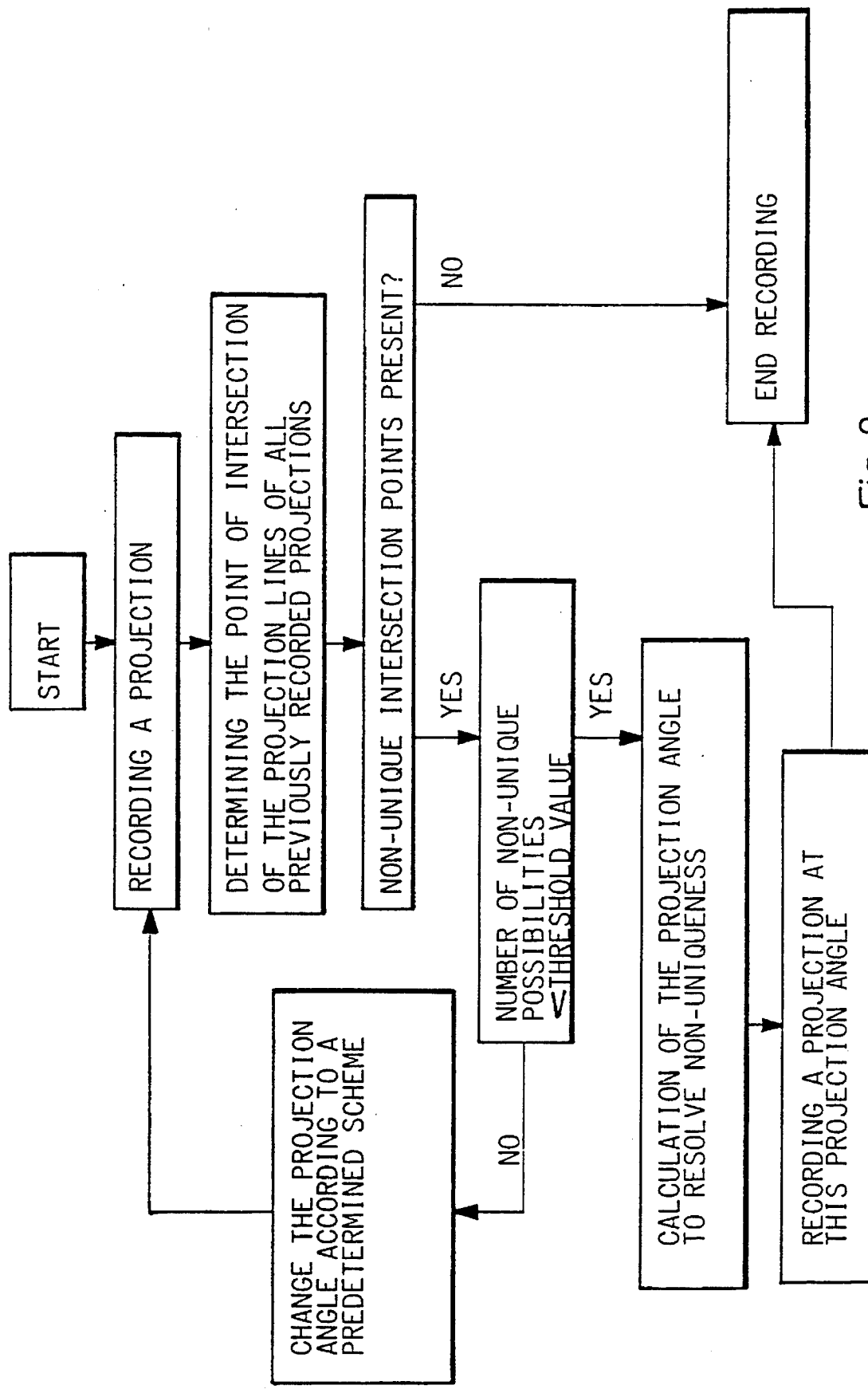
FIG. 8 shows a flow-diagram for the localization algorithm in accordance with the elimination method.

Towards this end there are other algorithms for the solution of the problem which are briefly described below.
Determination Through Elimination In the elimination procedure successively new projections are recorded. While recording each projection point of intersection in a list, one checks following each projection step whether or not non-uniqueness is present. If all non-unique possibilities are done away with, the recording process is stopped. The choice of angles transpires either in a predetermined sequence such as through incrementation of the angle of projection by a discrete amount in each case (see FIG. 7a), sampling of the corresponding projection angle lying halfway between (see FIG. 6a and 6b) or—in particular when the number of non-unique possibilities is small— through calculation of a final additional projection angle from the positions of the points of intersections which are still unclear in accordance with the above algorithm. A flow-diagram of such an algorithm is shown in FIG. 8.
Limitation to a Discrete Number of Experiments A further possibility is the carrying out of the experiment while inputting the number of projection steps, whereby this number is either previously fixed or is a function of the number of observed objects in the first two projections. As shown, in general, three projections are sufficient for a complete and unique solution to the problem posed. This, however, is true only for the choice of a projection angle for the third projection, which excludes all non-unique possibilities, i.e. is not equal to all possible intersection angles of the first two projections. When inputting the projection angle there is always a certain danger that non-uniqueness remains. The probability for such non-uniqueness is only equal to zero when the number of measured projections at different angles is greater than or equal to the number of input angles of intersection in Tab. I. Here one must, however, point out that this case is extremely unlikely. For a statistical spatial distribution of the objects, a measurement of a number of projections of the same order of magnitude as the maximum number of objects observed in the first two projections is sufficient for a complete localization of the objects. Even with measurements utilizing only three projections the probability of a unique solution is sufficiently high for many applications.

Localization of Objects Using the Intensity Information

Figure 9:
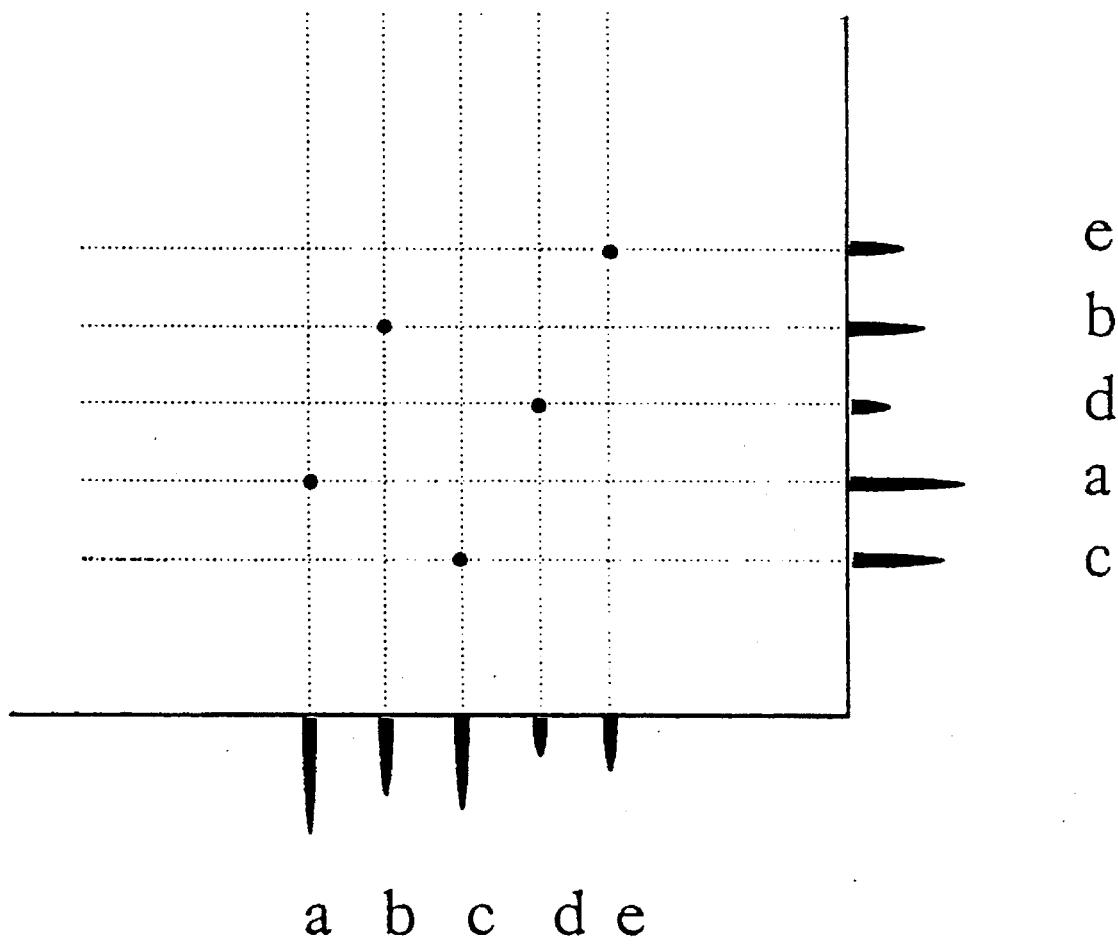
FIG. 9 shows a localization under utilization of the intensity information. If no overlaps occur and if all objects display differing signal intensities, a unique localization is already given with two projections.

The above methods assume that a localization takes place solely based on the measurement of the position of the objects at differing projection angles and the intensity information thereby remains unused. When taking advantage of the fact that the observed intensity of an object in a magnetic resonance imaging experiment, for otherwise constant measurement conditions independent of the choice of the angle of projection and, in particular, independent of a possible covering up by other objects, always contributes equally to the observed total signal, it is possible to further simplify the angulation method. For point-shaped objects of differing intensity, two projection directions already result in a unique localization as the point of intersection of the projection lines of the individual projections of equal intensity (FIG. 9).

Figure 10:
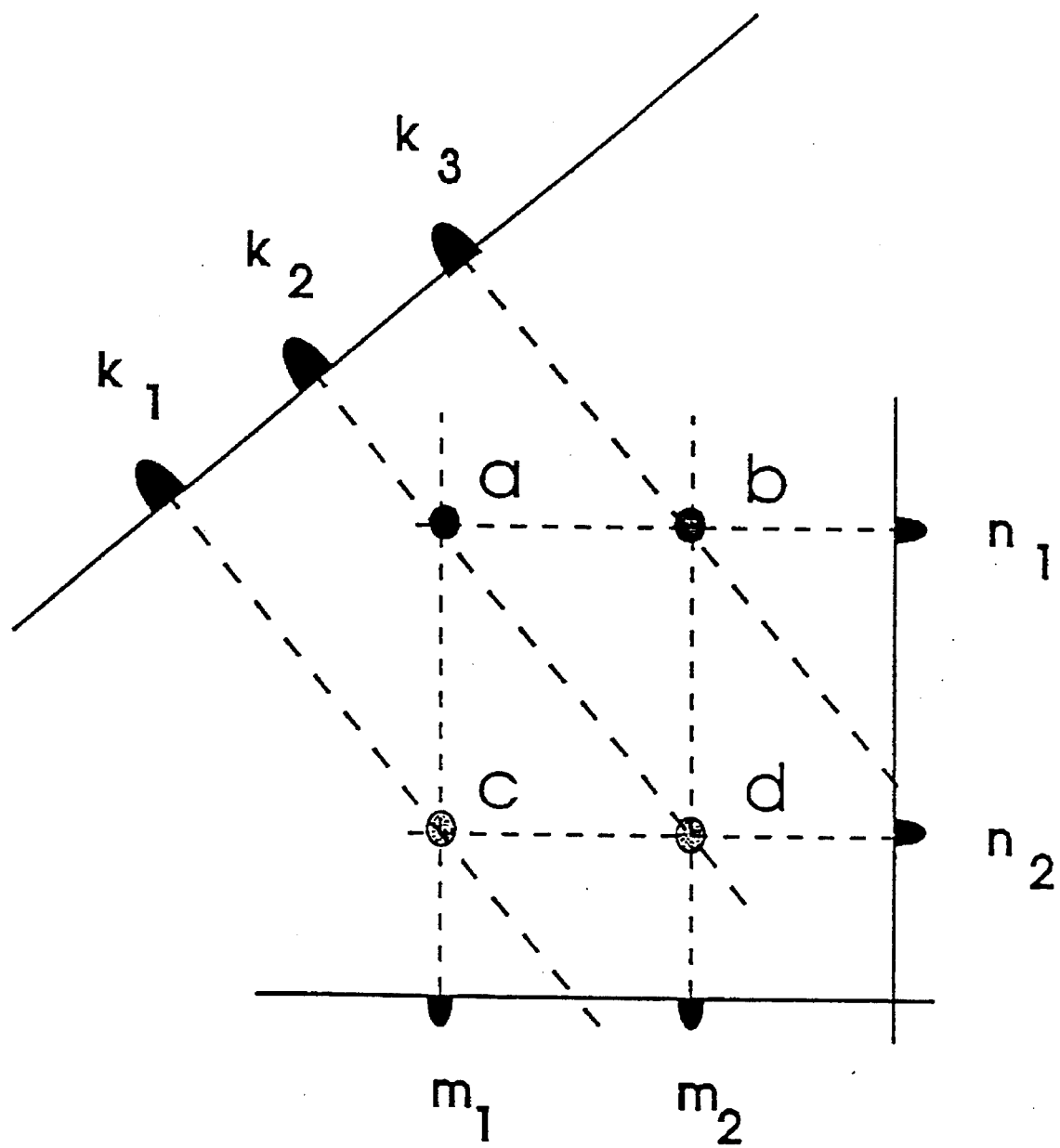
FIG. 10 shows a recording of three projections at projection angles which, following triangulation, exhibit non-uniqueness. Three objects with intensities a, b, c or four objects with intensities a, b, c, d could be present. Under utilization of the added signal intensities in the measured signals, a unique determination of the intensities in the 4 possible locations is given.

For overlapping objects even when utilizing the intensity information, two projections are not sufficient. Towards this end FIG. 10 shows that the signal intensities of two projections do not facilitate a unique assignment already for the situation of two apparent individual projections for each projection direction. The method described below, utilizing the signal intensities, assumes that objects are to be located at all points of intersection of the projection lines whose signal intensity must be determined. If an object is in fact not at such a point an intensity of zero is naturally derived for the assumed object.

When taking advantage of the intensity information in the case cited of 2 observed objects in each projection direction it is possible, by recording one further projection angle, to uniquely determine the position and intensity of the object even with a choice of projection angles which allows non-uniqueness. Utilizing the signal intensities it is possible with the above described methods, "determination through elimination" and "limitation to a discrete number of experiments" to achieve, a unique localization with an appropriately smaller number of recordings when varying the projection angle.

The intensities a, b, c, d of the objects assigned to each intersection point can be derived from the system of equations $$a+b=n_1$$

$$c+d=n_2$$

$$c=k_1$$

$$a+d=k_2$$

$$b=k_3$$

Here one should notice that for reasons of consistency the additional condition $$a+b+c+d=n_1+n_2=m_1+m_2k_1+k_2+k_3$$

must be fulfilled.

Localization of Objects Through Modulation of the Signal Phase

Figure 11:
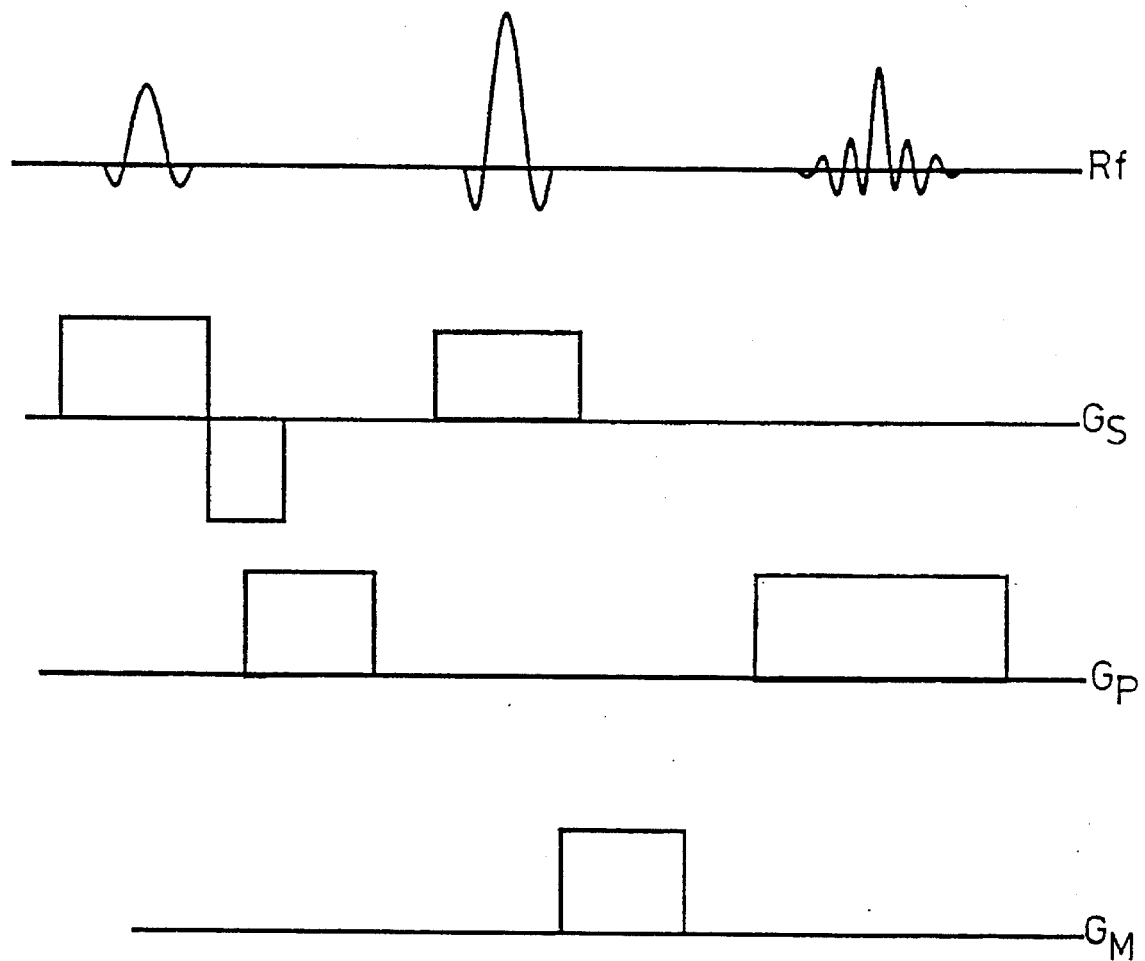
FIG. 11 shows a pulse program for the phase modulation of the signals in the direction perpendicular to the projection gradient $G_p$ by means of a phase modulation gradient $G_M$.

The non-uniqueness of the signal intensities shown in FIG. 10 can, in addition to recording an additional projection with varied projection direction, also be solved through the taking of an additional projection in one of the originally chosen directions if the phase of the signals is influenced through appropriate additional gradients in the projection direction. A pulse program which contains these additional gradients is shown in FIG. 11. With known gradient strength $G(x)$ of a gradient along the x-direction and with the assistance of the Larmor relationship, a phase angle α of the dephasing of each individual signal is given by $$\alpha_x = G(x) \times t_x,$$

whereby $t_x$ is the application time of the gradient and x the position of the object.

For a gradient in the direction of the projection corresponding to signals $n_1$ and $n_2$ one therefore has an entire projection signal of a and b $$I(n_1)=I_a\cos\alpha_a+I_b\cos\alpha_b+iI_a(\sin\alpha_a+I_b\sin\alpha_b)$$

With known gradient strength and known position of the gradient zero point it is thereby possible to uniquely calculate the signal intensities from the phase-unmodulated intensity $$I(n_1)=I_a+I_b$$

For more than 4 objects this procedure can be appropriately repeated so that for the solution of an n-fold non-uniqueness, the recording of a total of n corresponding phase-modulated projections in addition to a projection taken at a perpendicular direction or at an arbitrary additional projection angle are necessary and sufficient.

Figure 2A:
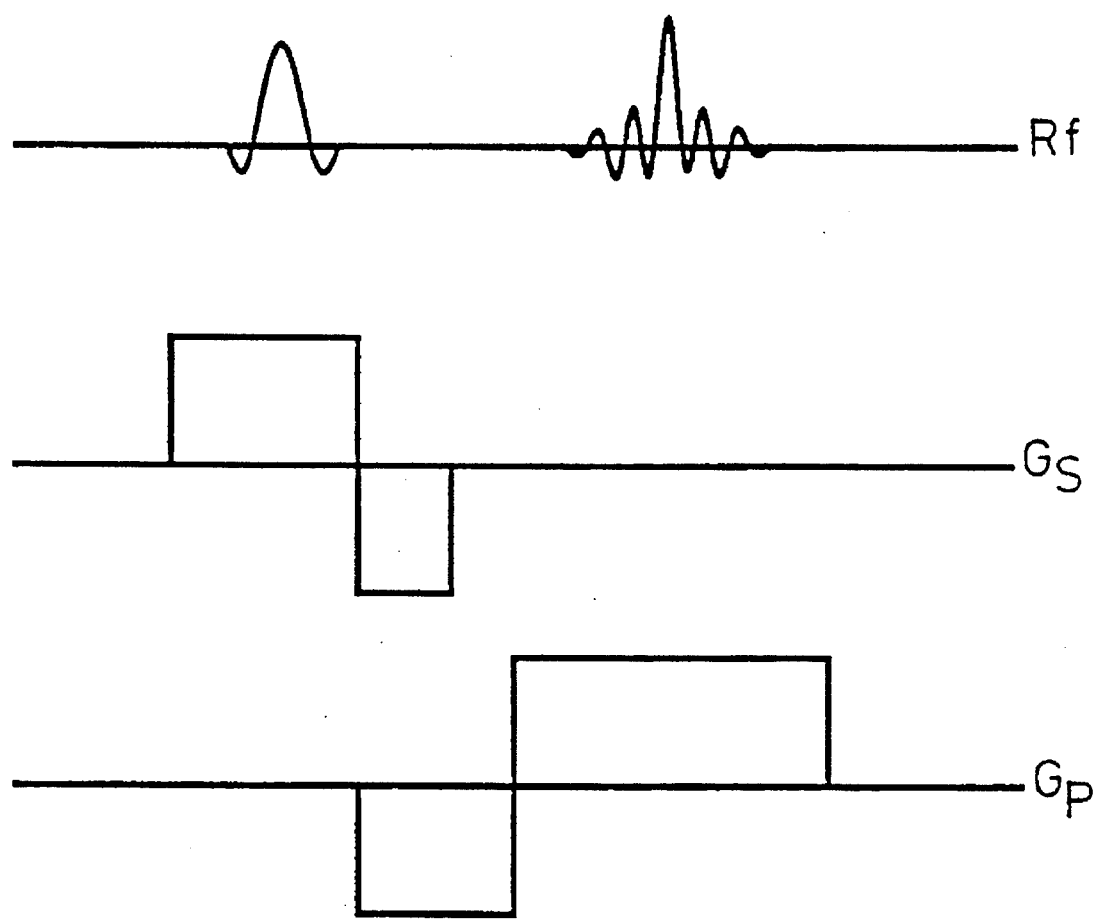
FIG. 2a shows a pulse program for the recording of a projection under utilization of a gradient echo sequence; RF hereby indicates the radio frequency pulse and signal, $G_s$ is the slice selection gradient and $G_p$ is the projection gradient (equal to the read gradient in imaging experiments).
Figure 2B:
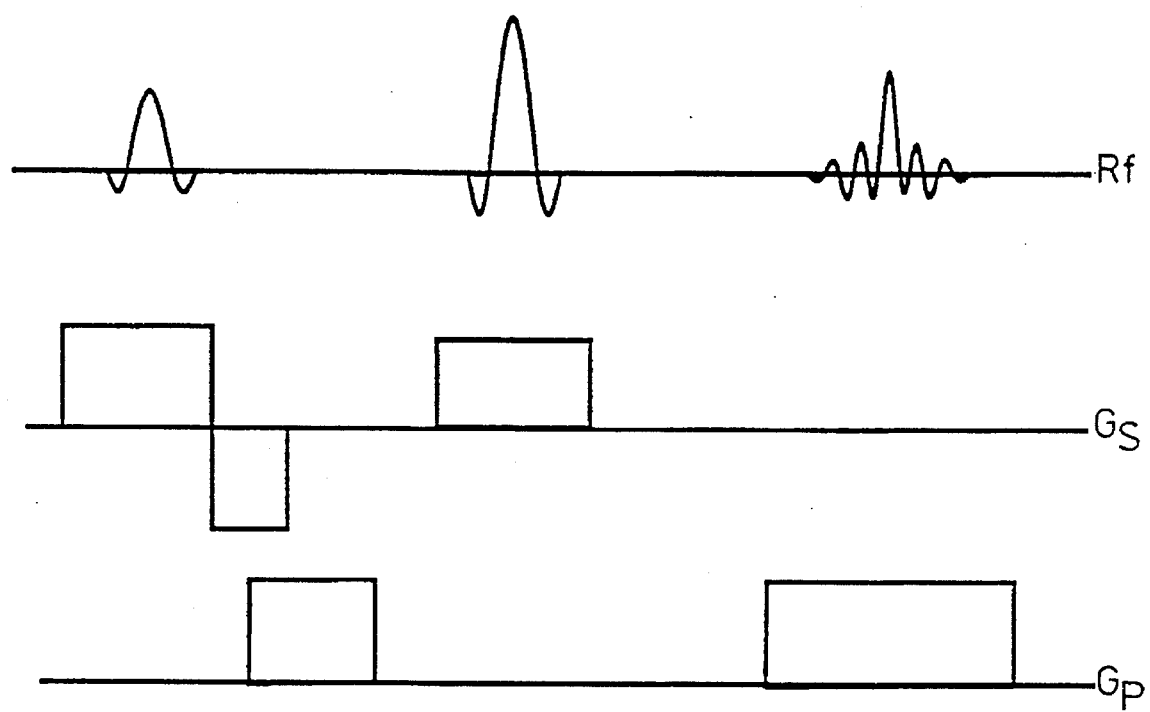
FIG. 2b shows a pulse program for the recording of a projection utilizing a spin-echo sequence (labels as in FIG. 2a).

Apart from an algorithm solving the linear equations described above, the location of objects can also be found using Fourier Transformation of the phase modulated data. In an especially favorable implementation, a limited number (typically 4–16) of projections are acquired in two orthogonal directions with a phase modulation gradient, which is orthogonal to the respective projection gradient and which is varied by a constant increment from one acquisition step to the other. The location of each object is then found after Fourier transformation along each phase modulation direction. The effect of this procedure is equivalent to a shortening of the projection lines, which are infinite in length in the basic implementation as shown in FIG. 1.

Localization of Objects Through Modulation of the Signal Intensity

Figure 12:
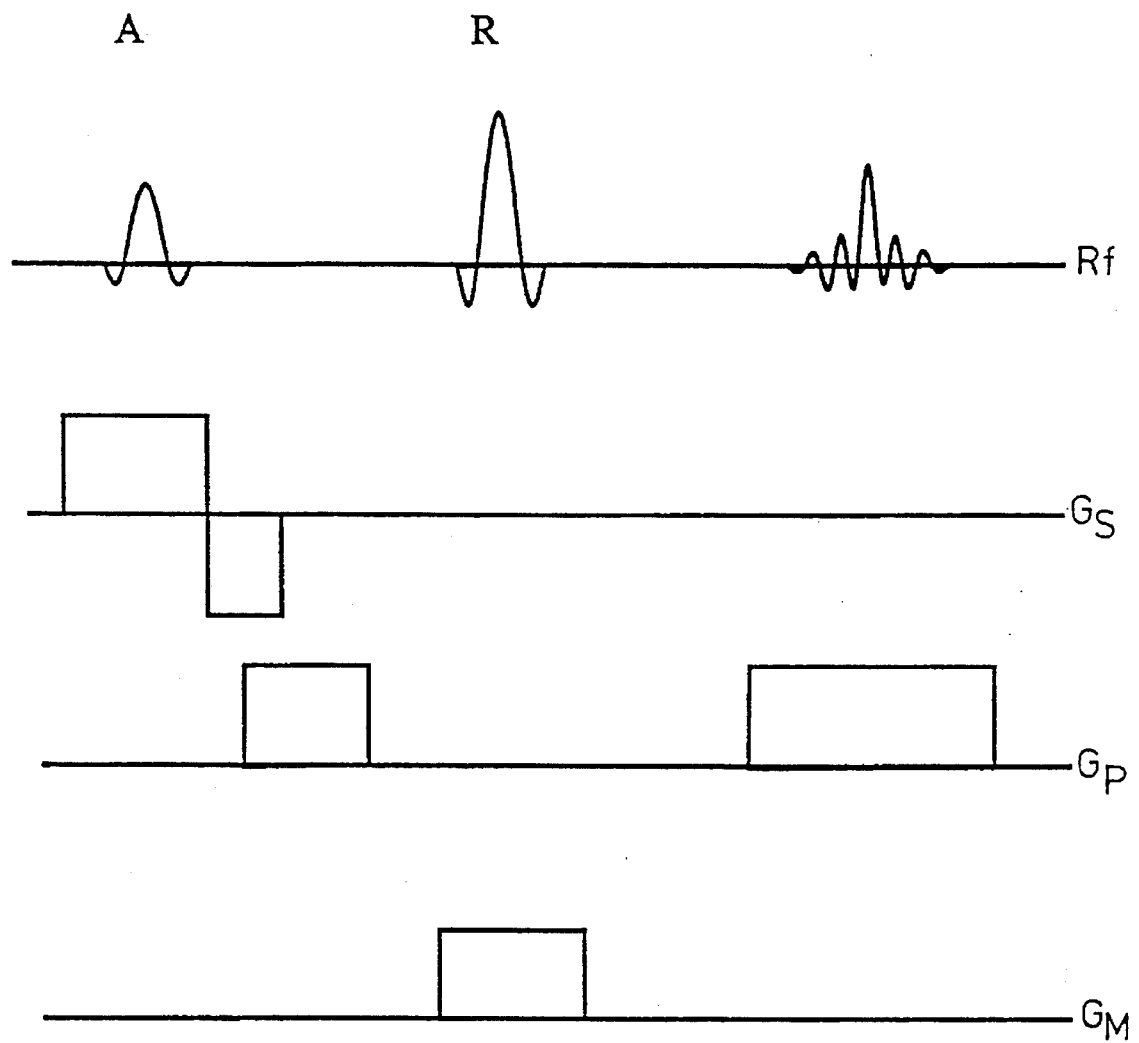
FIG. 12 shows a pulse program for amplitude modulation of the signals in a direction perpendicular to the projection gradient $G_p$ by refocussing of the signals produced by the excitation pulse A with a refocussing pulse which produces a modulated signal in the direction of a phase modulation gradient $G_M$ which is perpendicular to the projection gradient.

The non-uniqueness of the signal intensities shown in FIG. 10 can be resolved by recording an additional projection under variation of the projection direction or also by recording an additional projection in one of the two primarily chosen directions if the intensity of the signals is influenced by appropriate additional high frequency pulses and a gradient in the projection direction. A pulse program therefor is shown in FIG. 12. With known excitation profiles, the intensity of each projection is given by $$I(n_1)=c_aI_a+c_bI_b.$$

Figure 13A:
FIG. 13a shows two refocussing profiles for the realization of an experiment given by FIG. 12.
Figure 13A:
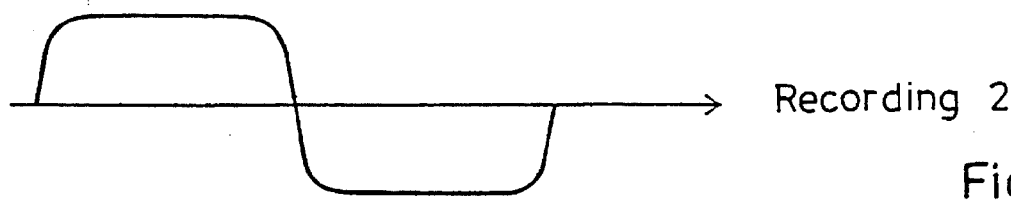
Figure 13B:
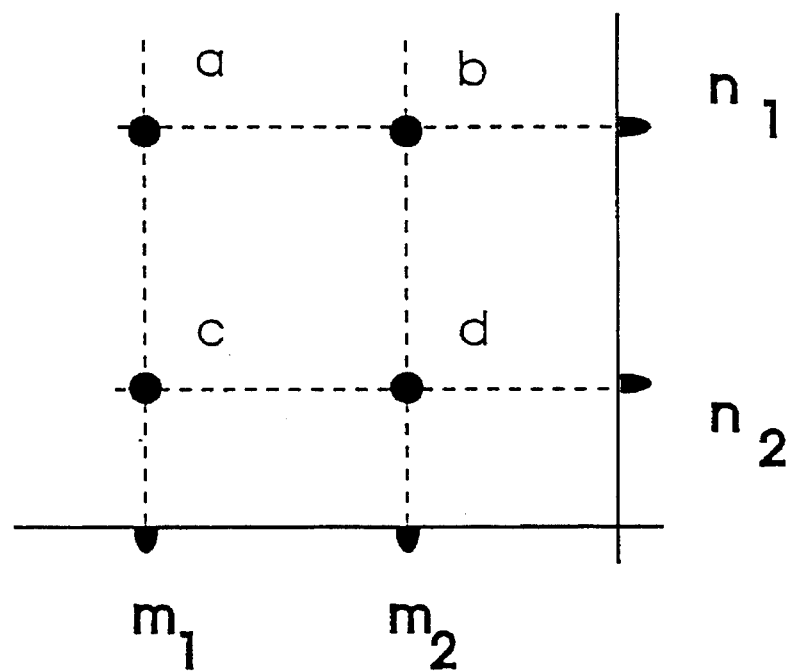
FIG. 13b shows the realization of an experiment given by FIG. 12 utilizing the two refocussing profiles of FIG. 13a to initially produce intensities b and d in a positive refocussed fashion, however in recording 2, inverted with respect to a and c.

The position dependent attenuation factors $c_a$ and $c_b$ are defined by the profile of the modulation pulse. A preferred possibility for amplitude modulation is given in that the signals in one portion of the recording volume are inverted. The attenuation factors then have, depending on the position of the inversion pulse, the value 1 or −1. By way of example, the case of FIG. 10 of two observed projections in each projection direction is once more treated. If one utilizes for the measurement in one experiment according to FIG. 12, either for the excitation pulse A or for the refocussing pulse R, initially entire signal contributing intensities a, b, c, d, however, in the subsequent recording a, −b, c, −d, (FIG. 13a and 13b) the observed observed intensities in the first measurement are given by $$n_1 = a+b$$

$$n_2 = c+d$$

$$m_1 = a+c$$

$$m_2 = b+d$$

and in the second measurement $$n_1' = a-b$$

$$n_2' = c-d$$

$$m_1' = a+c$$

$$m_2' = -b-d.$$

It is possible to uniquely determine a, b, c and d from these equations.

This method can be easily generalized to more than two observed objects in each projection direction whereby here—similar to the phase modulation procedure—the recording of n−1 different amplitude-modulated projections is necessary for unique intensity determination.

Other possibilities utilize pulses with flip angles changing monotonically or periodically as a function of the excitation frequency whereby, also in this case, the attenuation factors are predetermined and known in each case and the resulting system of equations can be solved uniquely.

Also in this case—as in the case of phase modulation—the recording of n amplitude modulated projections in one direction plus the recording of one individual projection at another—preferentially perpendicular—angle is sufficient for the unique determination of the signal intensities at all points of intersection of the projection rays.

Localization of Objects of Finite Extent

Algorithms were described above which are strictly applicable only when the objects to be localized are circular-shaped and of homogeneous signal intensity. For the case of objects of complex shape with internally inhomogeneous signal distributions, these algorithms are only applicable if the size of the objects is small compared to their separation so that their projections can be represented in a non-overlapping manner. If this is not the case the above-mentioned algorithms can be modified in such a fashion that projection bands instead of projection lines are generated and localization of the objects are determined as areas of intersection of these projection bands. With knowledge about the shape and signal distribution within the object—or with the introduction of plausible assumptions therefor—it is then possible to determine the location of the objects when taking advantage of the additional information of the observed width of the objects after appropriate modification of algorithms for point-shaped objects.

It is important to note that these algorithms only function when the number of overlaps is small compared to the number of observed objects. In general, the triangulation methods allow, by way of order of magnitude, only for the observation of as many groups as there are measurable separate objects in the individual projections. The fine structure of overlapping clusters of objects cannot be determined with this method, rather necessitates the utilization of real image reconstruction algorithms such as filtered back projection, whereby the number of recording steps is thereby no longer given by the number of objects, rather by the relationship between the size of the smallest object which can be resolved to the entire observational area. This points out that the triangulation method is only appropriately used when the number of objects and the area subtended thereby are small relative to the observational volume.

Application Under Active Selection of a Discrete Object Matrix

The above described algorithms are suitable for the determination of the position and signal intensity of discrete objects in an observation volume. These methods are suitable for the observation of a body with nearly equal distributions of signal-yielding elements if—as mentioned—a separation of the intensity distribution can be carried out through the selection of suitable measuring sequences, as is the case in MR-angiography, or measurement methods as is the case in observation of contrast means effects. In addition to this separation through the influence of the respective signal intensities, the above methods can also be carried out in connection with spatially selective high frequency pulses whose excitation profile is so chosen that only spins at a plurality of discrete locations within the observational volume are excited ("comb-shaped pulse").

Figure 14B:
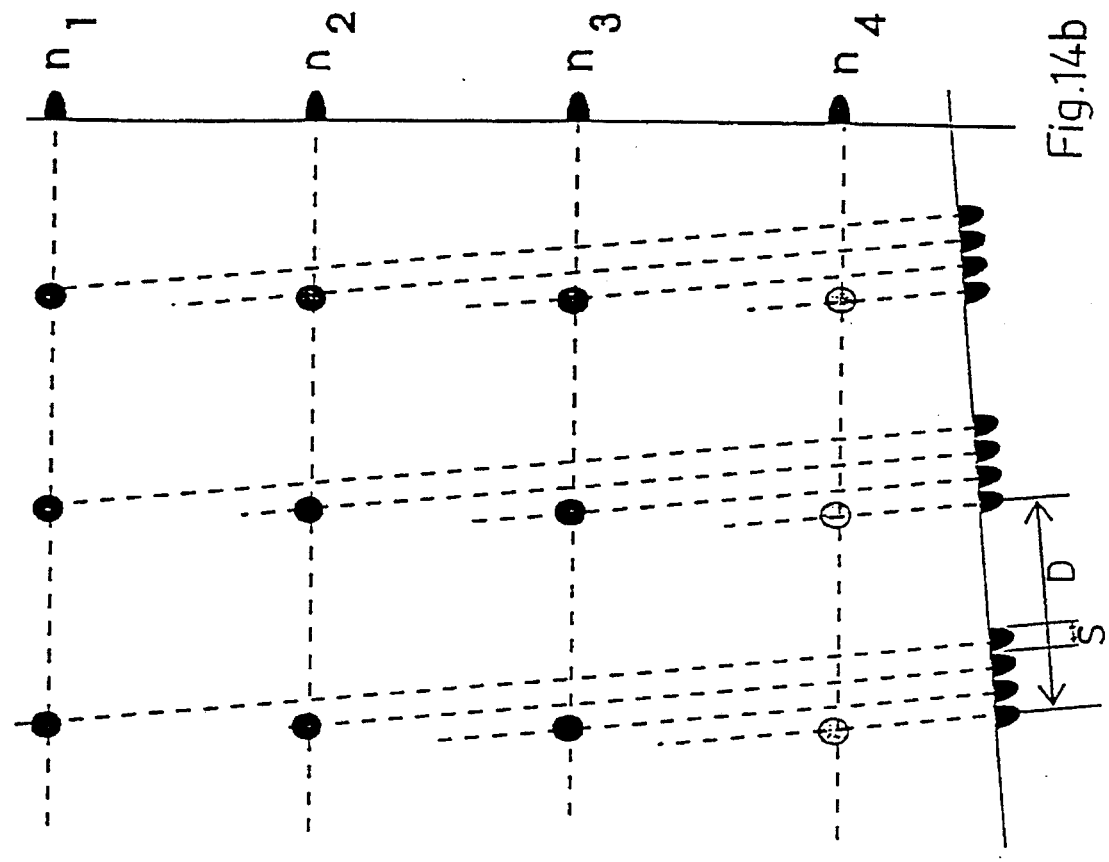
FIG. 14b shows a measurement of the signal intensities using appropriate non-perpendicular projections at locations which result from the application of pulses with frequency profiles which generate signals at a plurality of discrete locations. A pulse program for the excitation of the rectangular signal matrix is given by FIG. 12 when the excitation pulse A as well as the refocussing pulse R exhibit such a "comb profile".
Figure 14A:
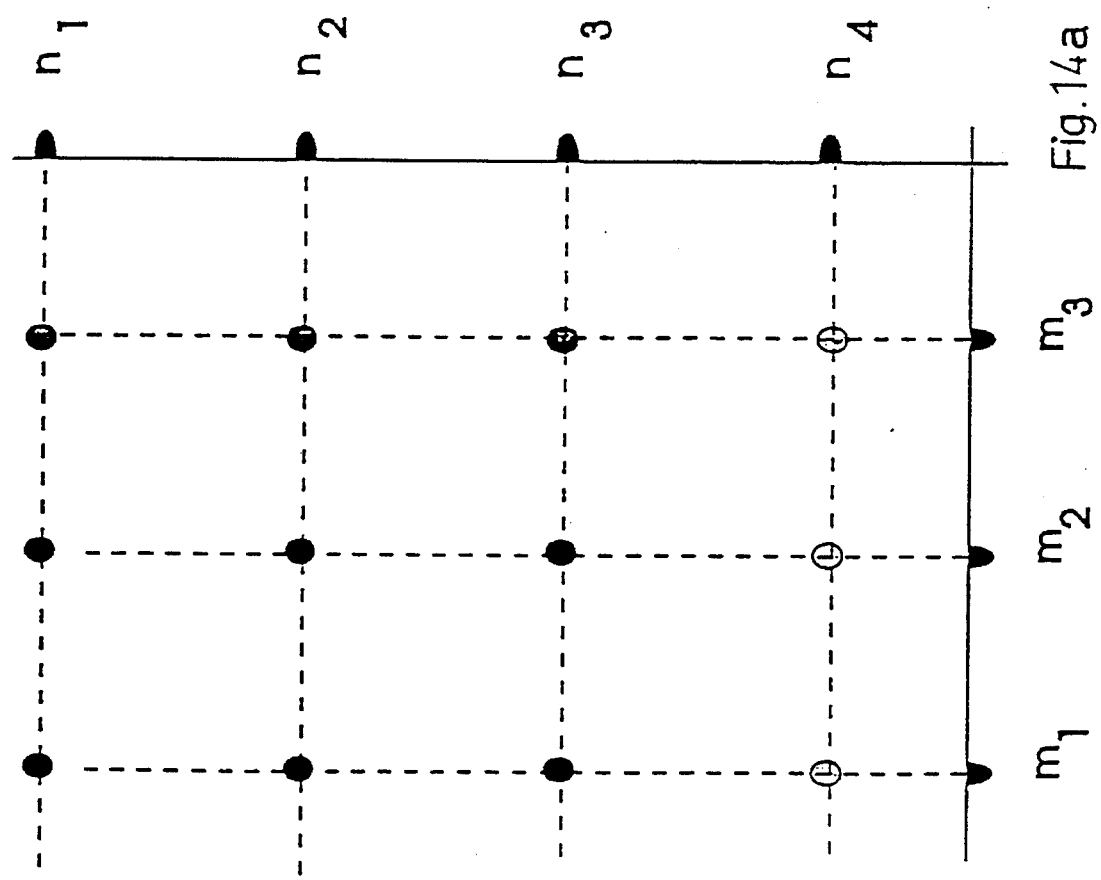
FIG. 14a shows a measurement of the signal intensities using perpendicular projections at locations which result from the application of pulses with frequency profiles which generate signals at a plurality of discrete locations. A pulse program for the excitation of the rectangular signal matrix is given by FIG. 12 when the excitation pulse A as well as the refocussing pulse R exhibit such a "comb profile".

The subdivision of a homogeneous body into discrete objects can thereby take place through the application of selective pulses in a multi-pulse sequence. In this fashion, through the application of three selective high frequency pulses, it is possible to excite a matrix of $a_1 \times a_2 \times a_3$ individual objects, whereby $a_1$, $a_2$, and $a_3$ each represent the number of slices selected by the pulses. In the simplest case ($a_1 = a_2 = a_3 = 1$) an individual object is produced in this fashion. In general, one of the pulses is utilized as an individual slice-selection pulse so that the object is then subdivided into $a_1 \times a_2$ individual objects. Since the position of the object matrix selected in this fashion is known and predetermined by the selection pulse, a triangulation experiment does not determine a position, rather the signal intensities at each position. For a homogeneous object matrix in which the size S of each object as well as the distance D between 2 objects is equally large in each case, the taking of a single projection is sufficient to separate all objects when $D > a_1 S$ or $D > a_2 S$ (FIG. 14a and 14b). If this condition is not fulfilled the recording of a plurality of projections and the evaluation according to one of the above described principles (localization of objects under utilization of the intensity information, through modulation of signal phase or through modulation of the signal intensity) is necessary.

By utilizing pulses which effect a position-dependent variation of the signal phase and/or amplitude it is also possible to utilize the above described method in order to achieve a unique assignment of signal intensities to the voxels selected by the pulses.

We claim:

1. A method of localizing the position of a finite number e of discrete individual objects in a slice through a measured object comprising the steps of:

a1) selecting the slice with a slice selection gradient, a2) positioning the measured object in a homogeneous stationary magnetic field $B_0$, a3) acquiring, in a first recording step, a first projection in a first projection direction perpendicular to a direction of the slice selection gradient in a plane of the slice, a4) acquiring, in a second recording step, a second projection in the plane of the slice in a second projection direction which differs from that of the first direction, a) determining the position of the e individual objects based on previous recording steps;

b) examining if the localization of the e individual objects is unique after step a);

b1) if yes, then ending execution;

b2) if no, then proceeding to step c);

c) determining if a number n of non-unique possibilities is smaller than a predetermined threshold value s;

c1) if yes, executing a further recording step with an encoding parameter which is changed with respect to all previously executed recording steps in accordance with a fixed predetermined scheme and, subsequently, returning to step a);

c2) if no, calculating an encoding parameter which is suitable for the resolution of at least a majority of non-unique possibilities for a subsequent recording step, carrying out this subsequent recording step, and ending execution.

2. The method of claim 1, wherein the first recording step comprises applying a slice selection gradient $G_s$ having a direction, exciting nuclear spins in the slice of the measured object through irradiation of a high frequency (HF) excitation pulse of small excitation band width, the slice being defined by a strength of the stationary magnetic field $B_0$, a position dependent strength of the slice selection gradient $G_s$ and a frequency band given by an excitation band width of the excitation pulse, inverting the slice selection gradient $G_s$ to reverse a defocussing of the excited nuclear spins in different parts of the slice, applying a projection gradient $G_p$ in a first projection direction exhibiting an angle with respect to the direction of the slice selection gradient $G_s$, inverting the projection gradient $G_p$ to produce a gradient echo, and recording the gradient echo, and, wherein in the second recording step, the method of the first recording step is repeated with an identical slice gradient, but with a second projection gradient direction which is likewise perpendicular to the slice selection gradient, but is different than the first projection gradient direction.

3. The method of claim 1, further comprising a third recording step having a third projection in a third direction which is different than that of the first and the second projection directions, the third recording step being executed between the second recording step and step a).

4. The method of claim 1, further comprising additional recording steps executed between the second recording step and step a), wherein the encoding parameter in at least one of step c1) and step c2) is a projection direction.

5. The method of claim 4, wherein in each additional recording step each projection has a direction halfway between projection angle directions of preceding projections.

6. The method of claim 4, wherein a projection angle of each additional recording step is incremented by a fixed predetermined value with respect to a projection angle of a preceding recording step.

7. The method of claim 6, wherein the steps a) to c2) comprise the recording of r projections at different predetermined projection angles, and $r \approx e \ll 256$.

8. The method of claim 1, further comprising recording and evaluating intensity information of each projection in all preceding recording steps to eliminate possible non-uniqueness in a determination of the positions of the e individual objects.

9. The method of claim 1, wherein the first and second recording steps each comprise a spin-echo sequence for signal excitation.

10. The method of claim 1, further comprising the application of time-of-flight angiography between two sequential recording steps, wherein for the investigation of discrete structures in a quasi-homogeneous object a separation process is undertaken in such a fashion that the sequential recording steps accentuate structures to be observed through the optimization of measurement parameters to recognize the structures with respect to a continuum of quasi-homogeneous remaining signals through the formation of threshold values.

11. The method of claim 10, wherein the separation process comprises a formation of differences between two sequential recording steps to observe discrete structures having signals differing in both recording steps, a difference between the two sequential recording steps being effected by an application of a contrast medium between both recording steps.

12. The method of claim 10, wherein the separation process comprises a formation of differences between two sequential recording steps to observe discrete structures having signal differing in both recording steps, a difference between the two sequential recording steps being effected through saturation of a fraction of the spins present in an entire volume by means of a saturation pulse sequence, wherein structures are detected which are engaged in an exchange of spins with saturated spins.

13. The method of claim 10, wherein the separation process comprises a formation of differences between two sequential recording steps to observe discrete structures having signals differing in both recording steps, wherein the two sequential recording steps are taken under essentially constant measuring conditions and signal differences between both recording steps are determined to record those discrete structures subject to a signal variation which is independent of the experiment.

* * * * *